(12) United States Patent
Kanai et al.

(10) Patent No.: US 7,205,671 B2
(45) Date of Patent: Apr. 17, 2007

(54) SEMICONDUCTOR DEVICE

(75) Inventors: Tomonori Kanai, Ibaraki (JP);
Kiyoharu Kishimoto, Ibaraki (JP); Yuji Kikuchi, Ibaraki (JP)

(73) Assignee: Hitachi Maxell, Ltd., Ibaraki-shi (JP)

( * ) Notice: Subject to any disclaimer, the term of this patent is extended or adjusted under 35 U.S.C. 154(b) by 24 days.

(21) Appl. No.: 10/662,382

(22) Filed: Sep. 16, 2003

(65) Prior Publication Data

US 2004/0145061 A1 Jul. 29, 2004

(30) Foreign Application Priority Data

Jan. 29, 2003 (JP) .............................. 2003-020939

(51) Int. Cl.
*H01L 23/52* (2006.01)
*H01L 23/48* (2006.01)
*H01L 29/40* (2006.01)

(52) U.S. Cl. .............................. 257/778; 257/E23.079; 257/773; 257/781; 438/108; 438/113

(58) Field of Classification Search ........ 257/776–781, 257/688, 773, 700, E23.079, E23.171, 737, 257/774, 758, 690, 692; 438/108, 113, 123, 438/612
See application file for complete search history.

(56) References Cited

U.S. PATENT DOCUMENTS

| 4,521,449 | A | * | 6/1985 | Arnold et al. | 430/125 |
|---|---|---|---|---|---|
| 5,468,999 | A | * | 11/1995 | Lin et al. | 257/784 |
| 5,511,306 | A | * | 4/1996 | Denton et al. | 29/840 |
| 5,844,317 | A | * | 12/1998 | Bertolet et al. | 257/773 |
| 5,886,414 | A | * | 3/1999 | Galloway | 257/784 |
| 6,013,953 | A | * | 1/2000 | Nishihara et al. | 257/778 |
| 6,204,564 | B1 | * | 3/2001 | Miyata et al. | 257/778 |
| 6,279,226 | B1 | * | 8/2001 | Ohkubo et al. | 29/740 |
| 6,365,978 | B1 | * | 4/2002 | Ibnabdeljalil et al. | 257/786 |
| 6,437,434 | B1 | * | 8/2002 | Sugizaki | 257/692 |
| 6,445,001 | B2 | * | 9/2002 | Yoshida | 257/48 |
| 6,469,370 | B1 | * | 10/2002 | Kawahara et al. | 257/678 |
| 6,525,414 | B2 | * | 2/2003 | Shiraishi et al. | 257/686 |
| 6,534,853 | B2 | * | 3/2003 | Liu et al. | 257/692 |
| 6,586,830 | B2 | * | 7/2003 | Saito | 257/700 |
| 6,686,659 | B2 | * | 2/2004 | Seshan | 257/737 |
| 6,697,261 | B2 | * | 2/2004 | Matsuda | 361/767 |
| 6,713,870 | B2 | * | 3/2004 | Fang | 257/734 |
| 6,734,568 | B2 | * | 5/2004 | Matsuo et al. | 257/781 |
| 6,794,739 | B2 | * | 9/2004 | Kobayashi et al. | 257/673 |

FOREIGN PATENT DOCUMENTS

JP 2000-208512 A 7/2000

* cited by examiner

*Primary Examiner*—Kenneth Parker
*Assistant Examiner*—Chris C. Chu
(74) *Attorney, Agent, or Firm*—Birch, Stewart, Kolasch & Birch, LLP

(57) ABSTRACT

A semiconductor device has peripheral electrode pads formed on the periphery of a semiconductor chip, land pads comprising the first land pads and the second land pads formed on the semiconductor chip, and circuits formed in the semiconductor chip. The peripheral electrode pads are connected to internal circuits by internal lines. The first land pads are connected to the peripheral electrode pads by rewired lines. The second electrode pads, on the other hand, are connected to the internal circuits by internal electrode pads and internal lines, not by the peripheral electrode pads.

8 Claims, 4 Drawing Sheets

DICING AREA

SEMICONDUCTOR DEVICE

CROSS-REFERENCE TO RELATED APPLICATION

The present invention is related to Japanese Patent Application Serial No. 2003-020939. It is hereby incorporated.

BACKGROUND OF THE DISCLOSURE

1. Field of the Invention

The present invention relates to semiconductor devices, and, more particularly, to arrangement of peripheral electrodes, internal electrodes, and internal lines of semiconductor chips.

2. Description of the Related Art

Demand for smaller, thinner, and lighter products is high in the area of electrical devices such as mobile phones, digital cameras, and notebook computers. Accordingly, development of smaller, thinner, and lighter semiconductor components used in the electrical devices with low production costs is an important subject for study.

Recently, BGA (ball grid array) and CSP (Chip Scale Package or Chip Size Package) have been increasingly developed and already put into practical use in some cases. The BGA and CSP are smaller packages that replace conventional IC packages such as TQFP (Thin Quad Flat Package) and TSOP (Thin Small Outline Package). Further, in order to achieve more compact and higher density mounting, widespread use of semiconductor mounting technology (connection technology) using bare chip mounting process with a flip-chip method is strongly desired.

Conventional bare chip mounting with the flip-chip method forms bumps on electrode pads of a semiconductor chip. Recently, however, such a technique has been increasingly used that rewires a semiconductor chip and forms land pads where bumps will be placed with a pad pitch designed as wide as possible to simplify the mounting. This technique is similar to those used for BGA and CSP mounting.

FIG. 9 shows an example of a semiconductor chip conventionally used for semiconductor devices employing the above technique. The semiconductor chip 10 shown in FIG. 9 has a plurality of peripheral electrode pads 1 on its periphery. The peripheral electrode pads 1 are connected to internal circuits (not shown) formed in the semiconductor chip 10 by internal lines (not shown). The peripheral electrode pads 1 are also connected to land pads 3 where bumps will be placed by rewired lines 2. The land pads 3 and the rewired lines 2 are formed by rewiring the chip. The land pads 3 that are pads for mounting solder balls are arranged uniformly on the semiconductor chip 10.

The above chip, however, has the following problems. In higher density mounting, the number of rewired lines 2 arranged between the land pads 3 increases; accordingly, the chance of short-circuit between two rewired lines 2 or between the rewired line 2 and the land pad 3 increases. For example, the rewired line 2 and the land pad 3 are short-circuited in the portions P, Q, and R in FIG. 9.

A technique for solving the short-circuit problem of the rewired lines 2 is disclosed in Japanese Unexamined Patent Application Publication No. 2000-208512. According to this technique, the electrodes having the same function share a single rewired line, thereby reducing the number of rewired lines.

Another problem of the above chip is that the land pads 3 and the internal circuits are connected via the peripheral electrode pads arranged on the periphery of the semiconductor chip 10, and hence the line lengths are long. The long line lengths lead to adverse impacts such as signal delay, line interference, and increased noise. The adverse impacts are significant in high-frequency semiconductor chips that are now increasingly used, creating crosstalk noise or resonance shift.

In the technique described in Japanese Unexamined Patent Application Publication No. 2000-208512, whether the short-circuit problem of rewired lines can be solved depends on the number of electrodes having the common function, and hence the short-circuit problem cannot be solved in all semiconductor devices. Besides, the line lengths cannot be reduced, and thus the problem of adverse impacts such as signal delay also cannot be solved.

SUMMARY OF THE INVENITON

Accordingly, an object of the present invention is to provide a semiconductor device which is compatible with both a packaging technology using wire bonding and a CSP technology using rewiring, and is capable of effectively solving problems such as short-circuit of rewired lines.

A semiconductor device according to this invention has peripheral electrodes (for example, peripheral electrode pads 1a and 1b in the embodiment described later) formed on a periphery of a semiconductor chip; internal electrodes (internal electrode pads 5, for example) formed inside the peripheral electrodes on the semiconductor chip; and circuits (metal layer 4b, for example,) formed in the semiconductor chip. In this semiconductor device, the peripheral electrodes are connected to the circuits by an internal line (metal layer 4a, for example), and the internal electrodes are connected to the circuits and the peripheral electrodes by the internal line. The semiconductor device with this structure is compatible with both a packaging technology using wire bonding and a CSP technology using rewiring. Further, if the internal electrodes are connected to area array electrodes (land pads 3, for example) by rewired lines, the area array electrodes are connected to the circuits without via the peripheral electrodes, and therefore the line lengths can be short. This structure allows preventing short-circuit between two rewired lines or between the rewired line and the area array electrodes. It also allows suppressing problems such as signal delay, line interference, and increased noise.

In the above semiconductor device, the internal electrodes are preferably smaller than the peripheral electrodes. This structure reduces electrical interference with the internal lines caused by the internal electrodes and increases design margins for the internal lines. It also facilitates wire bonding to the peripheral electrodes.

Further, the internal electrodes preferably comprise at least one selected from the group consisting of a power supply terminal, ground terminal, and clock terminal. Since the internal electrodes are connected to the circuits by the internal line, the line lengths can be short. Therefore, it is preferred to use the internal electrodes as terminals for signals that can be significantly affected by voltage drop such as power supply terminals, ground terminals, and clock terminals.

Furthermore, the peripheral electrodes not connected to the internal electrodes are preferably used as terminals for high-frequency signals. Since the internal electrodes are connected also to the peripheral electrodes by the internal line, the internal line connecting the internal electrodes and the peripheral electrodes become redundant lines. The redundant lines create unwanted impedance. High-frequency signals can be significantly affected by such impedance, and therefore terminals for the high-frequency signals are preferably not the internal electrodes but the peripheral electrodes not connected to the internal electrodes.

Another semiconductor device according to this invention has peripheral electrodes formed on a periphery of a semiconductor chip; internal electrodes formed inside the peripheral electrodes on the semiconductor chip; and circuits formed in the semiconductor chip. The peripheral electrodes are connected to the circuits by an internal line, and the internal electrodes are connected to the circuits and the peripheral electrodes by the internal line. The internal electrodes are also connected to rewired lines which are formed above the internal electrodes with an insulating layer therebetween. Area array electrodes are formed at ends of the rewired lines. Since the area array electrodes connected to the internal electrodes are connected to the circuits without via the peripheral electrodes, the line lengths can be short. This structure allows preventing short-circuit between two rewired lines or between the rewired line and the area array electrodes. It also allows suppressing problems such as signal delay, line interference, and increased noise.

Another semiconductor device according to the present invention has peripheral electrodes formed on a periphery of a semiconductor chip; internal electrodes formed inside the peripheral electrodes on the semiconductor chip; area array electrodes connected to selected one of the peripheral electrodes and the internal electrodes and formed on the semiconductor chip; and circuits formed in the semiconductor chip. The peripheral electrodes are connected to the circuits by an internal line, and the internal electrodes are connected to the circuits and the peripheral electrodes by the internal line. The area array electrodes comprise the first area array electrodes connected to the internal electrodes by rewired lines and the second area array electrodes connected to the peripheral electrodes by rewired lines. Since the first area array electrodes are connected to the circuits without via the peripheral electrodes, the line lengths can be short. This structure allows preventing short-circuit between two rewired lines or between the rewired line and the area array electrodes. It also allows suppressing problems such as signal delay, line interference, and increased noise.

Further, the first area array electrodes preferably comprise at least one selected from the group consisting of power supply terminals, ground terminals, and clock terminals. Since the first area array electrodes are connected to the circuits by the internal line, the line lengths can be short. Therefore, it is preferred to use the first area array electrodes as terminals for signals that can be significantly affected by voltage drop such as power supply terminals, ground terminals, and clock terminals.

Furthermore, the second area array electrodes are preferably used as terminals for high-frequency signals. Since the first area array electrodes are connected also to the peripheral electrodes by the internal line, the internal line becomes a redundant line. The redundant lines create unwanted impedance. High-frequency signals can be significantly affected by such impedance, and therefore terminals for the high-frequency signals are preferably not the first area array electrodes but the second area array electrodes not connected to the internal electrodes.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
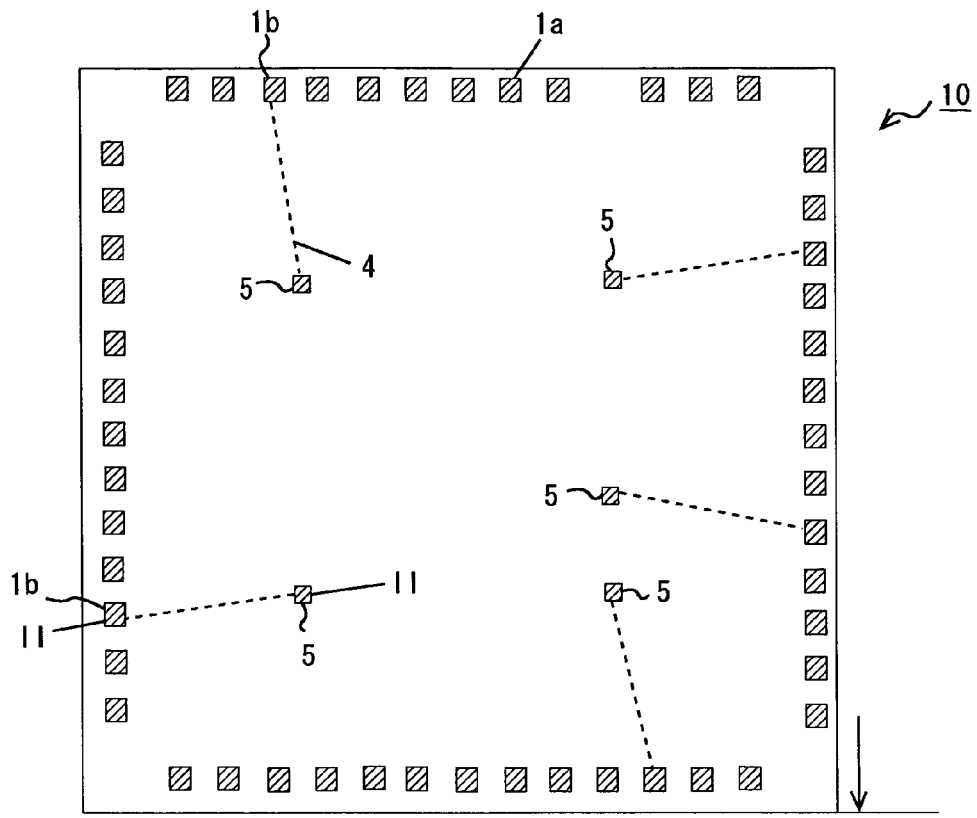
FIG. 1 is a view showing an example of line arrangement of a semiconductor chip according to the present invention before rewiring and land pad formation.
Figure 1:
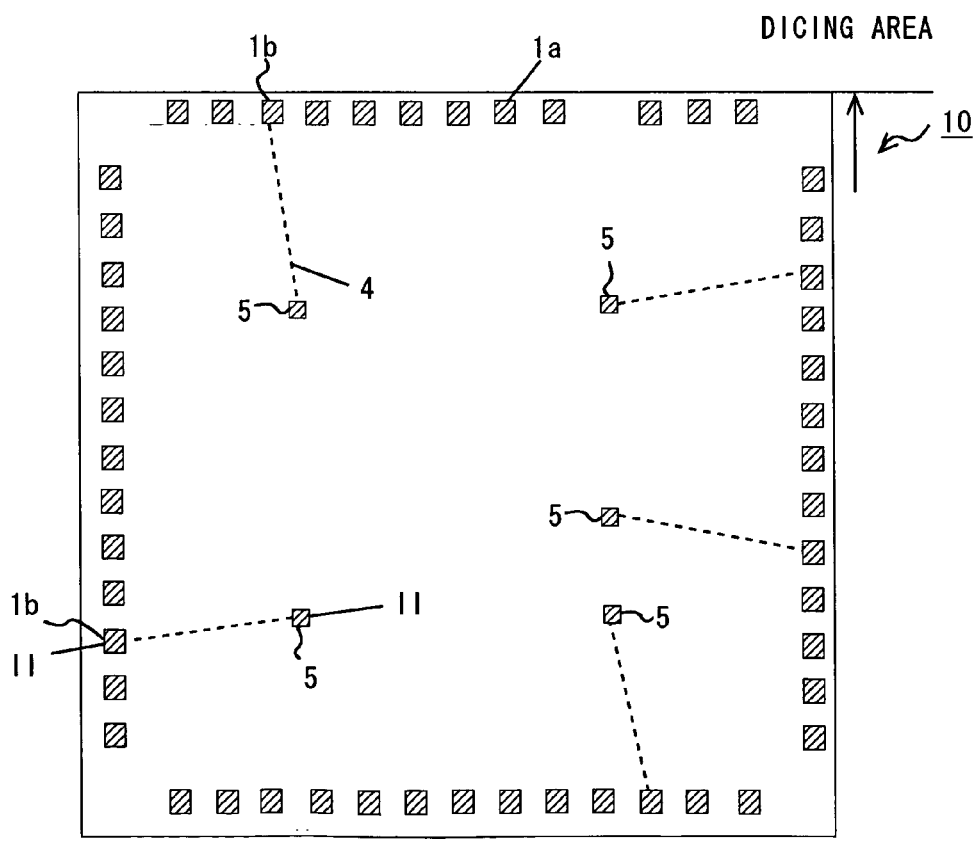

A semiconductor chip according to a preferred embodiment of the present invention will be explained hereinafter with reference to accompanying drawings. FIG. 1 shows an example of line arrangement of a semiconductor chip 10 before rewiring and land pad formation are performed. Two of the semiconductor chips 10 on a wafer are shown, and the space between the semiconductor chips 10 is a dicing area. The semiconductor chip 10 has a plurality of circuit blocks, for example. The circuit blocks include a CPU core, DSP core, analog circuit, analog-to-digital converter circuit, memories (ROM/RAM), and logic circuit.

As shown in FIG. 1, on the periphery of the semiconductor chip 10 are formed a plurality of peripheral electrode pads 1a and 1b that are peripheral electrodes. The peripheral electrode pads 1a and 1b are connected to various internal circuits (not shown) formed in the semiconductor chip 10 by internal lines (not shown). When inspecting the internal circuits of the semiconductor chip 10, the peripheral electrode pads 1a and 1b are used also as input/output terminals for inputting and outputting inspection signals where probe terminals of an inspection device are brought into contact.

On the inner side of the semiconductor chip 10 surrounded by the peripheral electrode pads 1a and 1b are formed internal electrode pads 5. The internal electrode pads 5 are connected to the internal circuits and the peripheral electrode pads 1b via the internal lines. In FIG. 1, only internal lines 4 connecting the internal electrode pads 5 to the peripheral electrode pads 1b are shown by broken lines. The internal electrode pads 5 are preferably as small as possible since a large principal surface increases electrical interference with the internal lines and reduces margins for the internal lines. The peripheral electrode pads 1a and 1b, on the other hand, need to have a size large enough to meet the accuracy limit of a wire bonding device. Accordingly, the principal surfaces of the internal electrode pads 5 are preferably smaller than those of the peripheral electrode pads 1a and 1b. Peripheral electrodes 1a are peripheral electrodes which are not connected to internal electrode pads 5, and peripheral electrodes 1b are peripheral electrodes which are connected to internal electrode pads 5 via internal lines.

Figure 2:
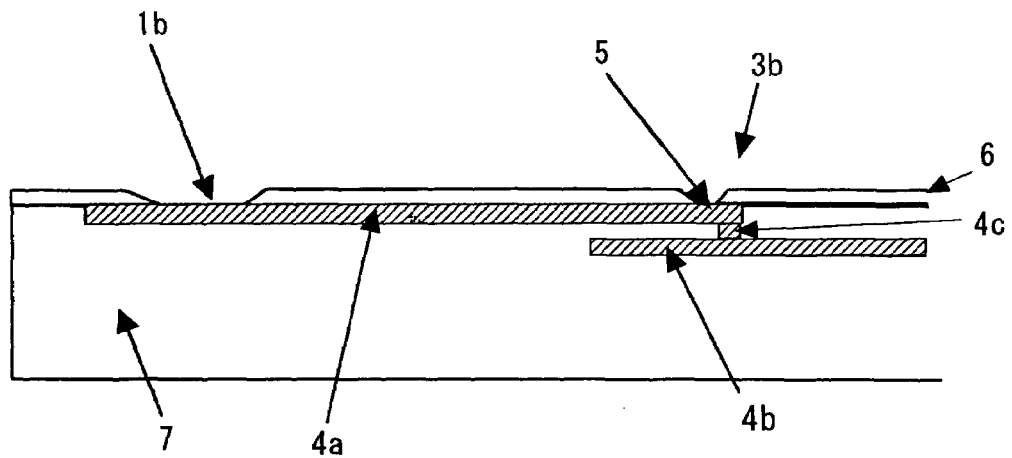
FIG. 2 is a fragmentary sectional view of the semiconductor chip according to the present invention.

FIG. 2 is a fragmentary sectional view of the semiconductor chip 10 according to this embodiment before rewiring and land pad formation are performed. It is a cross-sectional view along line II—II in FIG. 1. In this embodiment, metal layers 4a and 4b are formed in different layers inside silicon 7. The metal layers 4a and 4b are connected by a via 4c. The metal layer 4a and the via 4c are internal lines to connect the internal circuits formed inside the chip to each of the peripheral electrode pads 1b and the internal electrode pads 5. The metal layer 4b is a line of the internal circuit formed inside the chip. The metal layers 4a and 4b are formed by aluminum (A1), for example.

An insulating layer 6 is formed at the top surface of the silicon 7. A passivation layer (not shown) is generally formed directly under the insulating layer 6. The insulating layer 6 is formed by polyimide, for example. The insulation layer 6 has openings in the positions corresponding to the periphery of the semiconductor chip 10. The metal layer 4a is partly exposed in the openings of the insulating layer 6. The exposed portions of the metal layer 4a serve as the peripheral electrode pads 1b.

Besides the openings for the peripheral electrode pads 1b, the insulating layer 6 has openings in the inner region of the semiconductor chip 10 to create the connection with land pads (not shown). The metal layer 4a is partly exposed in the openings. The exposed portions of the metal layer 4a serve as the internal electrode pads 5.

The semiconductor chip 10 in this state may be connected to external terminals via the peripheral electrode pads 1a and 1b by wire bonding without rewiring and forming land pads. The semiconductor chip 10 may also be connected to external terminals via land pads after rewiring and land pad formation. Accordingly, the semiconductor chip 10 in this embodiment is processable by wafer level CSP packaging using rewiring technique, which has been difficult for a semiconductor with multiple pins, while maintaining compatibility with conventional packaging using wire bonding technique.

Figure 3:
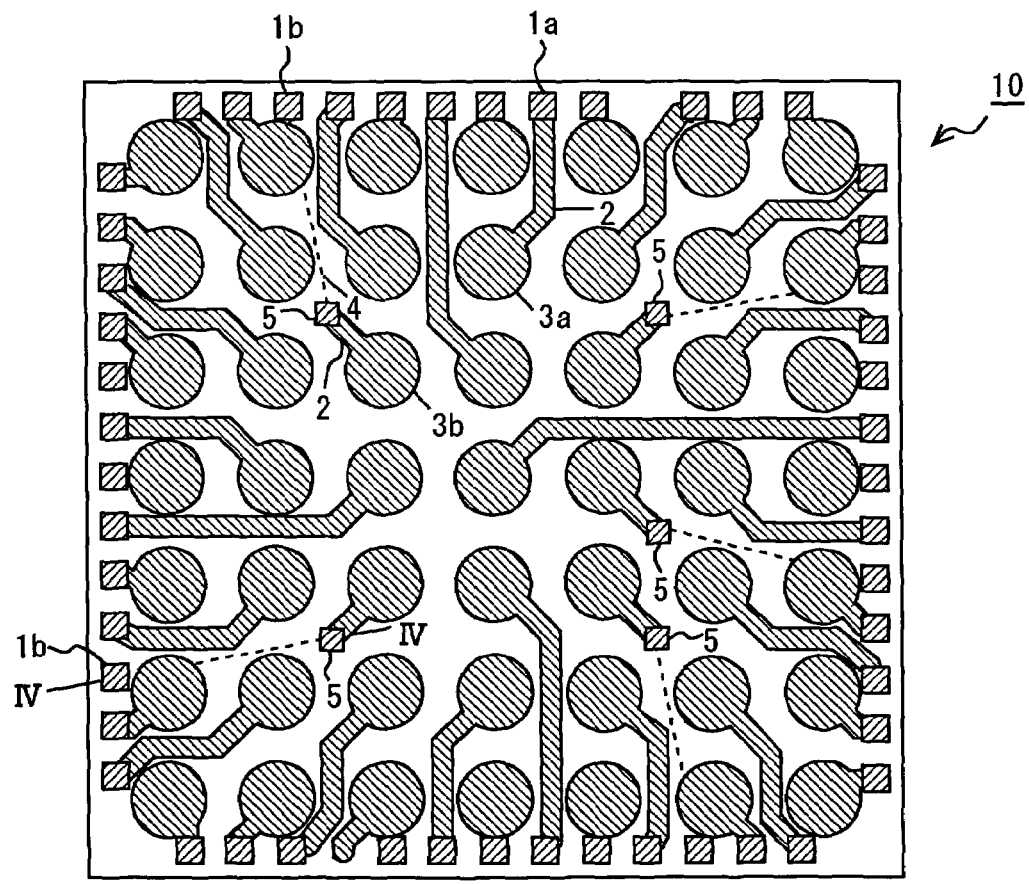
FIG. 3 is a view showing an example of line arrangement of the semiconductor chip according to the present invention after rewiring and land pad formation.

FIG. 3 shows an example of line arrangement of the semiconductor chip 10 after rewiring and land pad formation are performed.

Besides the peripheral electrode pads 1a and 1b and the internal electrode pads 5, rewired lines 2 and land pads 3 which are area array electrodes are formed entirely in the semiconductor chip 10. The rewired lines 2 are formed, for example, by depositing a copper or aluminum coating by sputtering, and the etching the coating to form a given pattern. The land pads 3 are plated films formed by plating, for instance. In this embodiment, the land pads 3 comprise two types: land pads 3a and land pads 3b.

The land pads 3a are connected to the peripheral electrode pads 1a by the rewired lines 2. The peripheral electrode pads 1a are connected to the internal circuits by the internal lines 4. Thus, the land pads 3a and the internal circuits are connected via the rewired lines 2, the peripheral electrode pads 1a, and the internal lines 4. Accordingly, the line lengths between the land pads 3a and the internal circuits are long.

The land pads 3b, on the other hand, are connected to the internal circuits not via the peripheral electrode pads 1b. The land pads 3b and the internal circuits are connected via the rewired lines 2, internal electrode pads 5, and the internal lines 4. Accordingly, the line lengths between the land pads 3b and the internal circuits are shorter than those between the land pads 3a and the internal circuits. It allows preventing short-circuit between two rewired lines or between the rewired line and the area array electrodes. It also allows suppressing problems such as signal delay, line interference, and increased noise.

The semiconductor chip 10 in this embodiment has an outside dimension of 3.75 mm×3.75 mm and 49 pins. The rewired line 2 has a line width of 90 μm, and the land pad 3 has a diameter of 300 μm.

Figure 4:
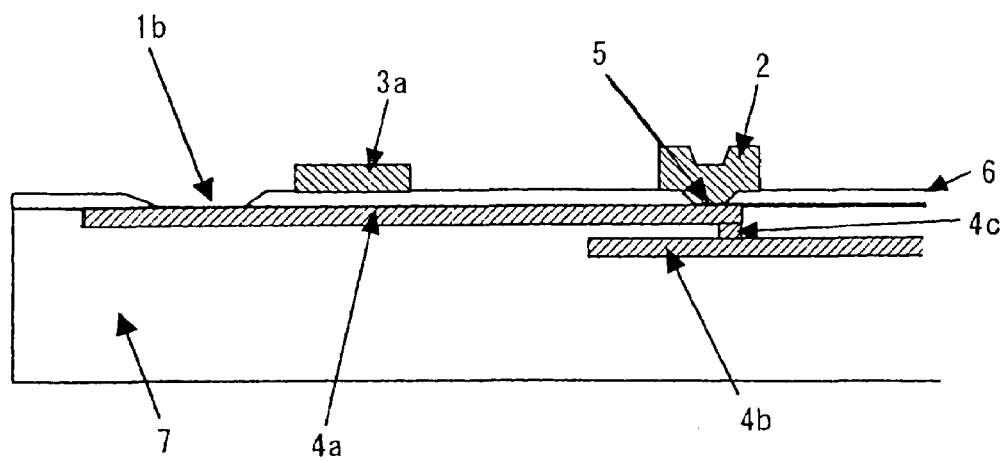
FIG. 4 is a fragmentary sectional view of the semiconductor chip according to the present invention.

FIG. 4 shows a fragmentary sectional view of the semiconductor chip 10 according to this embodiment after rewiring and land pad formation are performed. It is a cross-sectional view along line IV—IV in FIG. 3. As shown in FIG. 4, the internal electrode pads 5 are connected to the rewired lines 2. The rewired lines 2 are connected to the land pads 3b which are not shown in FIG. 4. FIG. 4 also shows part of the land pads 3a which are connected to the peripheral electrode pads 1a (not shown).

Though not shown in FIG. 4, an insulating film (insulating layer) is further deposited as a protective film. The insulating film has openings above the land pads 3.

Figure 5:
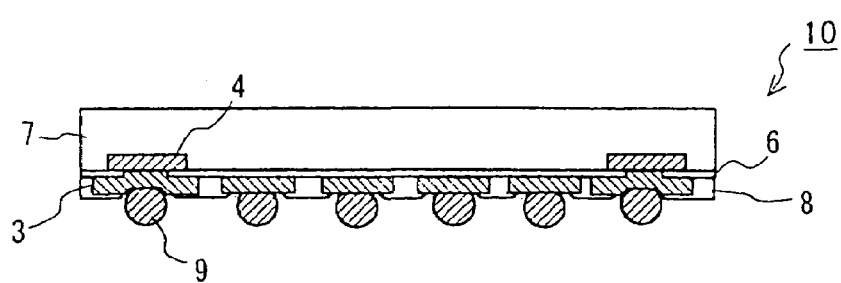
FIG. 5 is a sectional view of the semiconductor chip according to the present invention.

In the case where the semiconductor chip 10 is connected to external terminals via the land pads 3, a solder ball is mounted and attached to each of the land pads 3 by reflow soldering. FIG. 5 shows a sectional view of the semiconductor chip 10 in this state. As shown in FIG. 5, the internal lines 4 are formed inside the semiconductor chip 10. At the surface of the silicon 7 is formed the insulating layer 6 having openings. In the openings, the land pads 3 are connected to the internal lines 4. An insulating layer 8 having openings above part of the land pads 3 is further formed thereon. A solder ball 9 is mounted in each of the openings above the land pads 3.

Figure 6:
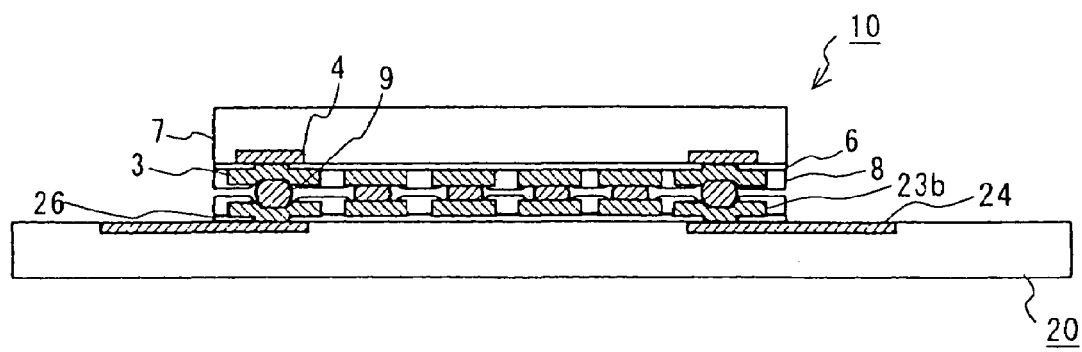
FIG. 6 is a sectional view showing the semiconductor chip according to the present invention mounted on a substrate.

FIG. 6 shows a sectional view of the semiconductor chip 10 of FIG. 5 mounted on a substrate Lines 24 are formed on a substrate 20, and terminals 23b are formed thereon via the openings of the insulating layer 26. The terminals 23b are formed on the positions corresponding to the solder balls 9 of the semiconductor chip 10. Thus, when the semiconductor chip 10 is mounted on the substrate 20 so that the chip surface with the solder balls 9 faces the substrate surface with the terminals 23b, the molten solder balls 9 create an electrical connection between terminals of the semiconductor chip 10 and the terminals of the substrate 20.

Figure 7:
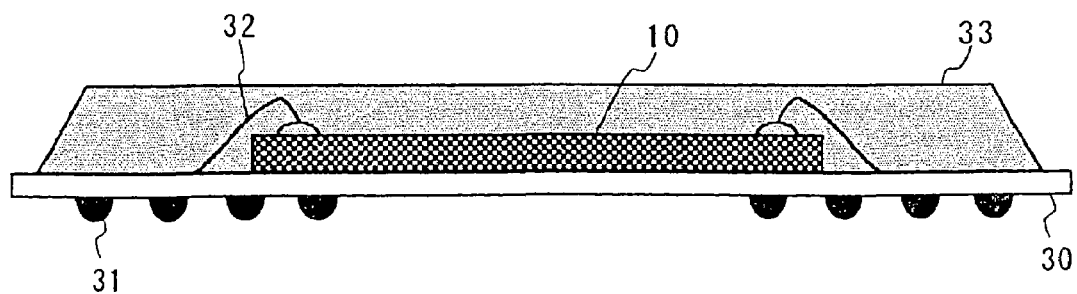
FIG. 7 is a sectional view showing the semiconductor chip according to the present invention mounted on a substrate by wire bonding.
Figure 8:
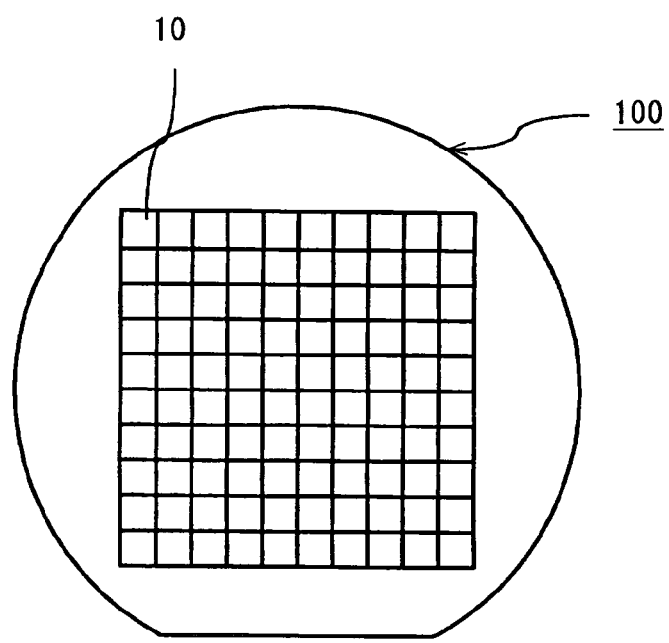
FIG. 8 is a view showing a semiconductor wafer including the semiconductor chips according to the present invention.
Figure 9:
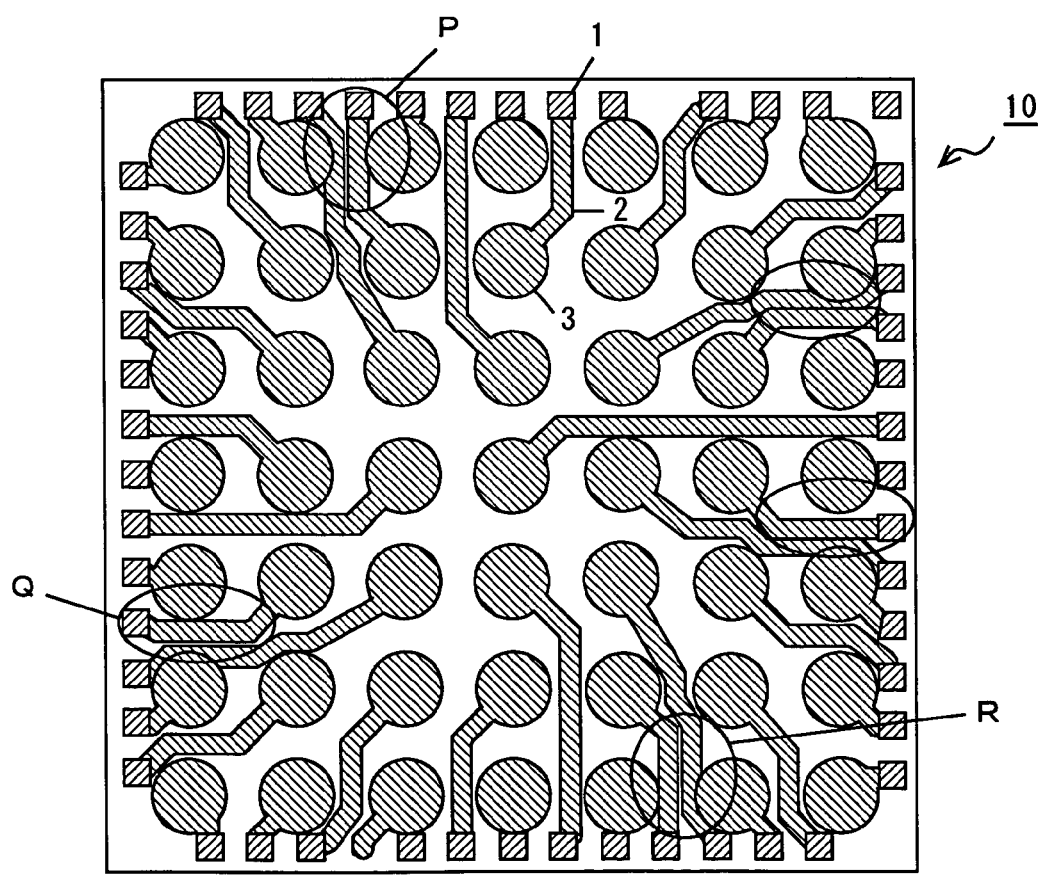
FIG. 9 is a view showing an example of line arrangement of a conventional semiconductor chip.

Now, a case where the semiconductor chip 10 is connected to external terminals via the peripheral electrode pads by wire bonding will be explained with reference to FIG. 7. In this case, CSP processing using rewiring technique as shown in FIG. 3 is not performed. The semiconductor chip 10 is mounted on a substrate 30 with the chip surface having the peripheral electrode pads facing up. The peripheral electrode pads are connected to terminals on the substrate 30 by bonding wires 32. After wire bonding, the semiconductor chip 10 is sealed by resin 33. The substrate 30 has solder balls 31 formed above lines in the bottom substrate surface.

When inspecting the semiconductor device, probe terminals of an inspection device are brought into contact with the electrodes of the semiconductor device to input and output signals. It is unfavorable to contact the prove terminals with the land pads 3 formed in the semiconductor chip 10. This is because contact pressure by the probe terminals can destroy the circuits below the land pads 3 during inspection. The semiconductor chip 10 in this embodiment can avoid the circuit destruction problem since the peripheral electrode pads on the chip periphery can be used as terminals for inspection even when the connection with external terminals is made by the land pads 3. Although the circuit destruction problem does not occur if no circuit is formed below the land pads 3, this decreases the efficiency of circuit design and thus fails to meet the demand for higher integration.

This embodiment of the present invention employs a connection structure where some of the peripheral electrode pads are connected to the land pads 3b via the internal electrode pads 5, which allows shorter line lengths. Terminals for inputting and outputting such signals that can be significantly affected by voltage drop preferably have short line lengths. Thus, it is preferred that such terminals are preferentially allocated to the land pads 3b connected to the internal circuits via the internal electrode pads 5. The terminals for inputting and outputting signals significantly affected by voltage drop include power supply terminals, ground terminals, and clock terminals.

On the other hand, the land pads 3b connected to the internal circuits via the internal electrode pads 5 as shown in FIG. 3 are not suitable for use as input/output terminals for high-frequency signals such as RF signals. This is because the internal lines 4 connecting the internal circuits and the peripheral electrode pads 1b become redundant lines when the land pads 3b are connected to external terminals, thereby generating incorrect impedance to distort signal waveforms.

Although the above embodiment has explained the semiconductor chip diced out of a wafer, the structures shown in FIGS. 1, 2, 3, and 4 are formed on a semiconductor wafer 100 before diced into chips. The semiconductor wafer 100 on which those structures are formed is then diced into small pieces, each of which is the semiconductor chip 10.

An example of a manufacturing process for the semiconductor chip 10 will be briefly explained hereinbelow. First, the internal lines 4 are formed in the semiconductor wafer 100. Next, the passivation layer and the insulating layer 6 having openings where the peripheral electrode pads will be exposed and where the land pads will be formed are formed at a surface of the semiconductor wafer 100. The insulating layer 6 is formed by photoresist coating, prebaking, exposure and development by photolithography process, and postbaking. After that, a copper coating is deposited by sputtering above the insulating layer 6 and the peripheral electrode pads.

The copper coating is then coated with photoresist. The photoresist is exposed, developed, and baked to form a resist pattern. The copper coating is etched using the resist pattern as an etching mask, thereby forming the rewires lines 2. The resist pattern is then stripped away. Further, the insulating layer 6 and the rewired lines 2 are coated with photoresist. The photoresist is exposed and developed to form the openings. After that, the solder balls 9 are placed in the openings and then attached to external connection terminals by reflow soldering.

Though the land pads 3 which are area array electrodes are uniformly arranged all over the semiconductor chip 10 in the above embodiment, it is not restricted thereto, and nonuniform arrangement of the land pads 3 is also possible. For example, the center portion of the semiconductor chip 10 may have no land pads 3.

As explained in the foregoing, the present invention can provide a semiconductor device which is compatible with both a packaging technology using wire bonding and a CSP technology using rewiring, and is capable of effectively solving problems such as short-circuit of rewired lines.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor device comprising:
   peripheral electrodes formed on an outermost portion of a semiconductor chip;
   internal electrodes formed inside the peripheral electrodes on the semiconductor chip; and
   circuits formed in the semiconductor chip,
   wherein the peripheral electrodes are connected to the circuits by an internal line, and the internal electrodes are connected to the circuits and the peripheral electrodes by the internal line, said internal line being covered by an insulating layer, and
   wherein a same signal is either an input and/or output either to or from both the internal electrode and the peripheral electrodes, and
   wherein rewiring is connected exclusively to either the peripheral electrodes which are not connected to the internal electrodes by the internal lines, or to the internal electrodes which are connected to the peripheral electrodes by the internal lines, and a wire is connected only to the peripheral electrodes connecting to external terminals using wire bonding, said peripheral electrodes and said internal electrodes being formed within openings provided in said insulating layer.

2. A semiconductor device according to claim 1, wherein the internal electrodes are smaller than the peripheral electrodes.

3. A semiconductor device according to claim 1, wherein the internal electrodes comprise at least one selected from the group consisting of a power supply terminal, a ground terminal, and a clock terminal.

4. A semiconductor device according to claim 1, wherein the peripheral electrodes not connected to the internal electrodes are used as terminals for RF signals.

5. A semiconductor device comprising:
   peripheral electrodes formed on an outermost portion of a semiconductor chip;
   internal electrodes formed inside the peripheral electrodes on the semiconductor chip; and
   circuits formed in the semiconductor chip,
   wherein the peripheral electrodes are connected to the circuits by an internal line covered by an insulating layer, the internal electrodes are connected to the circuits and the peripheral electrodes by the internal line, and the internal electrodes are also connected to rewired lines, the rewired lines formed above the internal electrodes with an insulating layer therebetween, and at ends of the rewired lines formed area array electrodes, and said peripheral electrodes and the internal electrodes being formed within openings provided in said insulating layer, and
   wherein the rewired lines are connected to the peripheral electrodes which are not connected to the internal electrodes by the internal line, and the rewired lines are not connected to the peripheral electrodes which are connected to the internal electrodes by the internal line.

6. A semiconductor device comprising:
   peripheral electrodes formed on an outermost portion of a semiconductor chip;
   internal electrodes formed inside the peripheral electrodes on the semiconductor chip;

area array electrodes connected to selected one of the peripheral electrodes and the internal electrodes and formed on the semiconductor chip; and circuits formed in the semiconductor chip, wherein the peripheral electrodes are connected to the circuits by an internal line covered by an insulating layer, the internal electrodes are connected to the circuits and the peripheral electrodes by the internal line, and the area array electrodes comprise first area array electrodes connected to the internal electrodes by rewired lines and second area array electrodes connected to the peripheral electrodes which are not connected to the internal electrodes by an internal line by rewired lines, said peripheral electrodes and the internal electrodes being formed within openings provided in said insulating layer; and wherein the area array electrodes are not connected to the peripheral electrodes which are connected to the internal electrodes by the internal line.

7. A semiconductor device according to claim 6, wherein the first area array electrodes comprise at least one selected from the group consisting of a power supply terminal, a ground terminal, and a clock terminal.

8. A semiconductor device according to claim 6, wherein the second area array electrodes are used as terminals for RF signals.

* * * * *